United States Patent
Wang et al.

(10) Patent No.: US 10,546,771 B2
(45) Date of Patent: Jan. 28, 2020

(54) HIGH RESISTIVITY SILICON-ON-INSULATOR SUBSTRATE HAVING ENHANCED CHARGE TRAPPING EFFICIENCY

(71) Applicant: SunEdison Semiconductor Limited (UEN201334164H), Singapore (SG)

(72) Inventors: Gang Wang, Grover, MO (US); Jeffrey L. Libbert, O'Fallon, MO (US); Shawn George Thomas, Chesterfield, MO (US); Qingmin Liu, Glen Carbon, IL (US)

(73) Assignee: GlobalWafers Co., Ltd., Hsinchu (TW)

(*) Notice: Subject to any disclaimer, the term of this patent is extended or adjusted under 35 U.S.C. 154(b) by 33 days.

(21) Appl. No.: 15/727,723

(22) Filed: Oct. 9, 2017

(65) Prior Publication Data
US 2018/0114720 A1    Apr. 26, 2018

Related U.S. Application Data

(60) Provisional application No. 62/412,937, filed on Oct. 26, 2016.

(51) Int. Cl.
| | | |
|---|---|---|
| *H01L 21/762* | (2006.01) | |
| *H01L 21/02* | (2006.01) | |
| *H01L 27/12* | (2006.01) | |

(52) U.S. Cl.
CPC .... *H01L 21/76254* (2013.01); *H01L 21/0245* (2013.01); *H01L 21/02381* (2013.01); *H01L 27/1203* (2013.01)

(58) Field of Classification Search
CPC ......... H01L 21/76254; H01L 21/02381; H01L 21/0245
See application file for complete search history.

(56) References Cited

U.S. PATENT DOCUMENTS

| | | |
|---|---|---|
| 4,501,060 A | 2/1985 | Frye et al. |
| 4,755,865 A | 7/1988 | Wilson et al. |
| 4,968,384 A | 11/1990 | Asano |
| 5,189,500 A | 2/1993 | Kusunoki |
| 6,043,138 A | 3/2000 | Ibok |
| 6,373,113 B1 | 4/2002 | Gardner et al. |

(Continued)

FOREIGN PATENT DOCUMENTS

| | | |
|---|---|---|
| EP | 0939430 A2 | 1/1999 |
| EP | 0926709 A2 | 6/1999 |

(Continued)

OTHER PUBLICATIONS

International Search Report and Written Opinion of the International Searching Authority regarding PCT/US2017/055722 dated Jan. 22, 2018, pp. 1-16.

(Continued)

*Primary Examiner* — Errol V Fernandes
(74) *Attorney, Agent, or Firm* — Armstrong Teasdale LLP

(57) ABSTRACT

A multilayer semiconductor on insulator structure is provided in which the handle substrate and an epitaxial layer in interfacial contact with the handle substrate comprise electrically active dopants of opposite type. The epitaxial layer is depleted by the handle substrate free carriers, thereby resulting in a high apparent resistivity, which improves the function of the structure in RF devices.

37 Claims, 6 Drawing Sheets

(56) References Cited

U.S. PATENT DOCUMENTS

| | | |
|---|---|---|
| 6,465,045 B1 | 10/2002 | Heuer et al. |
| 6,562,127 B1 | 5/2003 | Kud et al. |
| 6,624,047 B1 | 9/2003 | Sakaguchi et al. |
| 7,868,419 B1 | 1/2011 | Kerr et al. |
| 7,879,699 B2 | 2/2011 | Schulze et al. |
| 7,915,716 B2 | 3/2011 | Pisigan et al. |
| 8,058,137 B1 | 11/2011 | Or-Bach et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 8,796,116 B2 | 8/2014 | Grabbe et al. |
| 8,846,493 B2 | 9/2014 | Libbert et al. |
| 8,859,393 B2 | 10/2014 | Ries et al. |
| 9,202,711 B2 | 12/2015 | Liu et al. |
| 2002/0090758 A1 | 7/2002 | Henley |
| 2004/0002197 A1 | 1/2004 | Fathimulla |
| 2004/0005740 A1 | 1/2004 | Lochtefeld |
| 2004/0031979 A1 | 2/2004 | Lochtefeld |
| 2004/0108537 A1 | 6/2004 | Tiwari |
| 2005/0153524 A1 | 7/2005 | Maa |
| 2005/0167002 A1 | 8/2005 | Ghyselen |
| 2006/0030124 A1 | 2/2006 | Maa |
| 2006/0033110 A1 | 2/2006 | Alam |
| 2006/0226482 A1 | 10/2006 | Suvorov |
| 2007/0032040 A1 | 2/2007 | Lederer |
| 2007/0054466 A1 | 3/2007 | Hebras |
| 2008/0153251 A1 | 6/2008 | Kostrzewa |
| 2009/0004833 A1 | 1/2009 | Suzuki |
| 2009/0014828 A1 | 1/2009 | Mizushima |
| 2009/0092810 A1 | 4/2009 | Lee |
| 2009/0294804 A1* | 12/2009 | Goodman ......... H01L 27/14687 257/213 |
| 2009/0321829 A1 | 12/2009 | Nguyen |
| 2011/0174362 A1 | 7/2011 | Tanner |
| 2011/0298083 A1 | 12/2011 | Yoneda |
| 2012/0091587 A1 | 4/2012 | Or-Bach |
| 2012/0161310 A1 | 6/2012 | Brindle |
| 2012/0238070 A1 | 9/2012 | Libbert |
| 2012/0267681 A1 | 10/2012 | Nemoto |
| 2013/0120951 A1 | 5/2013 | Zuo |
| 2013/0122672 A1 | 5/2013 | Or-Bach |
| 2013/0168835 A1 | 7/2013 | Botula |
| 2013/0193445 A1 | 8/2013 | Dennard |
| 2013/0294038 A1 | 11/2013 | Landru |
| 2013/0344680 A1* | 12/2013 | Arriagada ......... H01L 21/02365 438/459 |
| 2014/0042598 A1 | 2/2014 | Kitada |
| 2014/0070215 A1 | 3/2014 | Bedell |
| 2014/0084290 A1 | 3/2014 | Allibert |
| 2014/0120654 A1 | 5/2014 | Fujii |
| 2014/0124902 A1 | 5/2014 | Botula |
| 2014/0273405 A1 | 9/2014 | Liu |
| 2015/0004778 A1 | 1/2015 | Botula |
| 2015/0115480 A1 | 4/2015 | Peidous |
| 2018/0294182 A1* | 10/2018 | Wang ................ H01L 21/76254 |

FOREIGN PATENT DOCUMENTS

| | | |
|---|---|---|
| EP | 1081748 A2 | 3/2001 |
| EP | 1865551 A1 | 12/2007 |
| EP | 2426701 A1 | 7/2012 |
| EP | 2503592 A1 | 9/2012 |
| JP | H01315144 A | 12/1989 |
| JP | 2012253364 A | 12/2012 |
| WO | 2009120407 A2 | 10/2009 |
| WO | 2012127006 A1 | 9/2012 |
| WO | 2015112308 A1 | 7/2015 |
| WO | 2016081356 A1 | 5/2016 |

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

Lederer, D. et al., Enhanced High resistivity SOI wafers for RF Applications, 2004, IEEE International SOI Conference, Oct. 2004, pp. 46-47.

Lederer, D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si Substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Jounral of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Allied Physics, Oct. 15, 1996 American Institute of Physics, pp. 4767-4769, vol. 70, No. 8.

Gao, Min, et al., Two-dimensional network of dislocations and nanocavities in hydrogen-implanted and two-step annealed silicon, Applied Physics Letters, American Institute of Physics, May 18, 1998, pp. 2544-2546, vol. 72, No. 26.

\* cited by examiner

HIGH RESISTIVITY SILICON-ON-INSULATOR SUBSTRATE HAVING ENHANCED CHARGE TRAPPING EFFICIENCY

CROSS REFERENCE TO RELATED APPLICATION(S)

This application claims priority to U.S. provisional application Ser. No. 62/412,937, which was filed Oct. 26, 2016, the disclosure of which is hereby incorporated by reference as if set forth in its entirety.

FIELD OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one method of creating a semiconductor-on-insulator structure 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaẽ and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

The present invention is directed to a method of preparing a multilayer substrate, the method comprising: epitaxially depositing an epitaxial layer on the front surface of a single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm and the epitaxial layer has a resistivity between about 100 ohm-cm and about 5000 ohm-cm; depositing a charge trapping layer on the epitaxial layer, the charge trapping layer comprising polycrystalline silicon having a resistivity of at least about 3000 ohm-cm; and bonding a dielectric layer on a front surface of a single crystal semiconductor donor substrate to the charge trapping layer to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

The present invention is further directed to a method of preparing a multilayer substrate, the method comprising: epitaxially depositing an epitaxial layer on the front surface of a single crystal semiconductor handle substrate, wherein the comprises single crystal semiconductor handle substrate two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate comprises an electrically active p-type dopant selected from the group consisting of boron, aluminum, gallium, indium, and any combination thereof and the epitaxial layer comprises an electrically active n-type dopant selected from the group consisting of arsenic, phosphorus, antimony, and any combination thereof, wherein the concentration of the electrically active n-type dopant is less than about $1 \times 10^{14}$ atoms/$cm^3$; depositing a charge trapping layer on the epitaxial layer, the charge trapping layer comprising polycrystalline silicon; and bonding a dielectric layer on a front surface of a single crystal semiconductor donor substrate to the charge trapping layer to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

The present invention is still further directed to a multilayer structure comprising: a single crystal semiconductor handle substrate, wherein the single crystal semiconductor handle substrate comprises two major, generally parallel surfaces, one of which is a front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate comprises an electrically active p-type dopant selected from the group consisting of boron, aluminum, gallium, indium, and any combination thereof; an epitaxial layer in interfacial contact with the front surface of the single crystal semiconductor handle substrate, wherein the epitaxial layer comprises an electrically active n-type dopant selected from the group consisting of arsenic, phosphorus, antimony, and any combination thereof, wherein the concentration of the electrically active n-type dopant is less than about $1 \times 10^{14}$ atoms/cm$^3$; a charge trapping layer in interfacial contact with the epitaxial layer, the charge trapping layer comprising polycrystalline silicon; a dielectric layer in interfacial contact with the charge trapping layer; and a single crystal semiconductor device layer in interfacial contact with the dielectric layer.

Other objects and features will be in part apparent and in part pointed out hereinafter.

DETAILED DESCRIPTION OF THE EMBODIMENT(S) OF THE INVENTION

Figure 1:
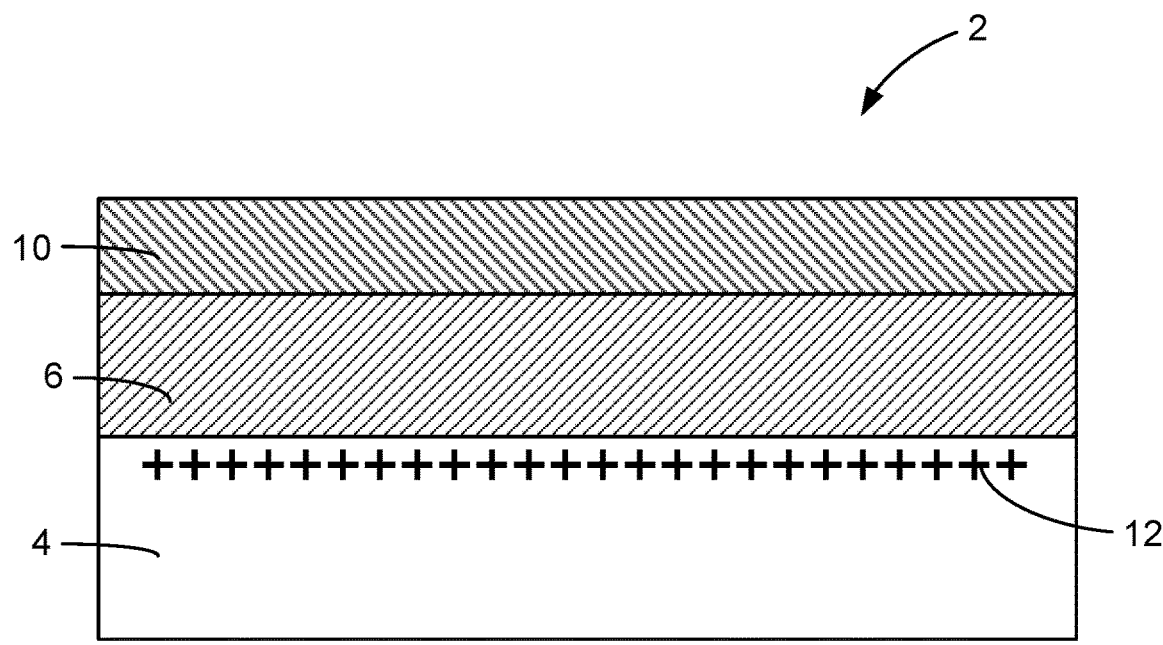
FIG. 1 is a depiction of a silicon-on-insulator wafer comprising a high resistivity substrate and a buried oxide layer.
Figure 2:
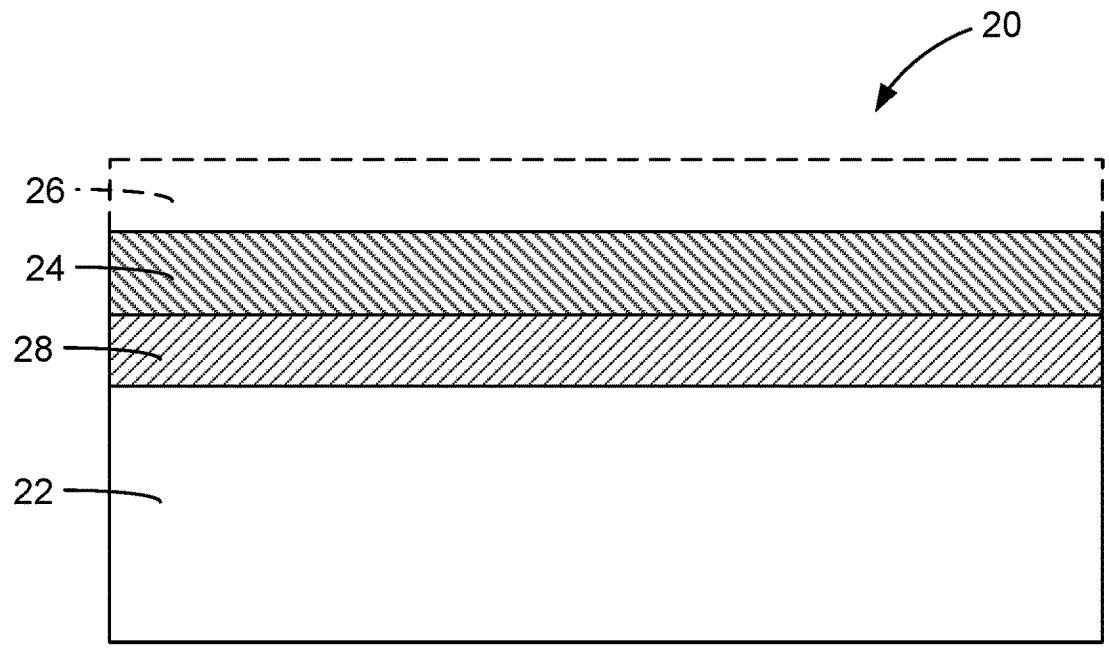
FIG. 2 is a depiction of a silicon-on-insulator wafer according to the prior art, the SOI wafer comprising a polysilicon charge trapping layer between a high resistivity substrate and a buried oxide layer.

According to the present invention, a method is provided for preparing a semiconductor-on-insulator composite structure (SOI, e.g., a silicon-on-insulator composite structure) comprising a charge trapping layer (CTL). The present invention is further directed to a semiconductor-on-insulator composite structure (e.g., a silicon-on-insulator composite structure comprising a charge trapping layer (CTL). This disclosure provides a method of engineering the single crystal semiconductor handle substrate to enhance electrical performance of SOI structure used in radiofrequency devices.

In some embodiments, the present invention is directed to a method of manufacturing SOI wafers by engineering the interface between the polycrystalline silicon charge trap layer (CTL) and the substrate (which may have a resistivity, in some embodiments, within the range of between about 1,000 ohm-cm and about 6,000 Ohm-cm) to thereby significantly improve the performance of completed RF devices. In addition to the polycrystalline silicon charge trapping layer, it has been demonstrated that the substrate resistivity plays a role in suppressing the $2^{nd}$ and $3^{rd}$ harmonic distortion (HD2 and HD3). Increasing the substrate resistivity to >10,000 Ohm-cm (ultrahigh resistivity, UHR) minimizes the free carriers so that the HD2/HD3 is more effectively suppressed. It may, however, be difficult to obtain and control such high resistivity by engineering the crystal pulling process as any contamination and process variation can lead to yield loss. Moreover, wafer thermal processing may lead to thermal donor generation from the oxygen incorporated during crystal growth process, which can change the resistivity or even flip the type of P-type substrates. Other processing issues caused by the UHR substrates may include wafer handling by electric chuck, metrology challenge requires a certain conduction, like capacitance gauge, SRP, etc. Furthermore, contaminants such as boron and aluminum which are trapped at the bond interface can readily diffuse through the polycrystalline silicon and reduce the resistivity of the polycrystalline silicon layer or induce recrystallization of the polycrystalline silicon layer either of which again reduces the effectiveness of the polycrystalline silicon at improving the RF performance. In view thereof, in some preferred embodiments, the single crystal semiconductor handle substrate for use in the manufacture of an SOI structure according to the present invention may have resistivity in the range of about 1,000 ohm-cm and about 6,000 Ohm-cm to achieve superior HD2/HD3 suppression. The handle substrate comprises an epitaxial layer having a target resistivity within the range of between about 100 ohm-cm and about 5000 ohm-cm, such as between about 200 ohm-cm and about 2000 ohm-cm, such as between about 400 ohm-cm and about 1000 ohm-cm. The target resistivity is the measured resistivity of the layer without depletion, which is typically obtained for a layer grown on a substrate of the same type, e.g., N-type epitaxial layer on n-type substrate or p-type epitaxial layer on p-type substrate. According to some embodiments of the present invention, the epitaxial layer is deposited with electrically active dopants of opposite type compared to the substrate, e.g., the substrate may comprise p-type dopants, while the epitaxial layer is deposited with an n-type dopant or the substrate may comprise n-type dopants, while the epitaxial layer is deposited with an p-type dopant. By doping the epitaxial layer with a dopant of the opposite type, the epitaxial layer may be depleted by the opposite type substrate. That is, the epitaxial layer doped with n-type dopant may be depleted by the p-type substrate, or the epitaxial layer doped with p-type dopant may be depleted by the n-type substrate. Accordingly, the epitaxial layer has an apparent resistivity that is much higher than the target resistivity. The apparent resistivity is the measured resistivity of a given sample, such as the engineered case in FIG. 4 where the 5 micrometer thick n-type epitaxial silicon layer is depleted by the p-type substrate. Since the carriers in the epitaxial layer are depleted, the measured resistivity is more than 10 times higher.

Figure 5:
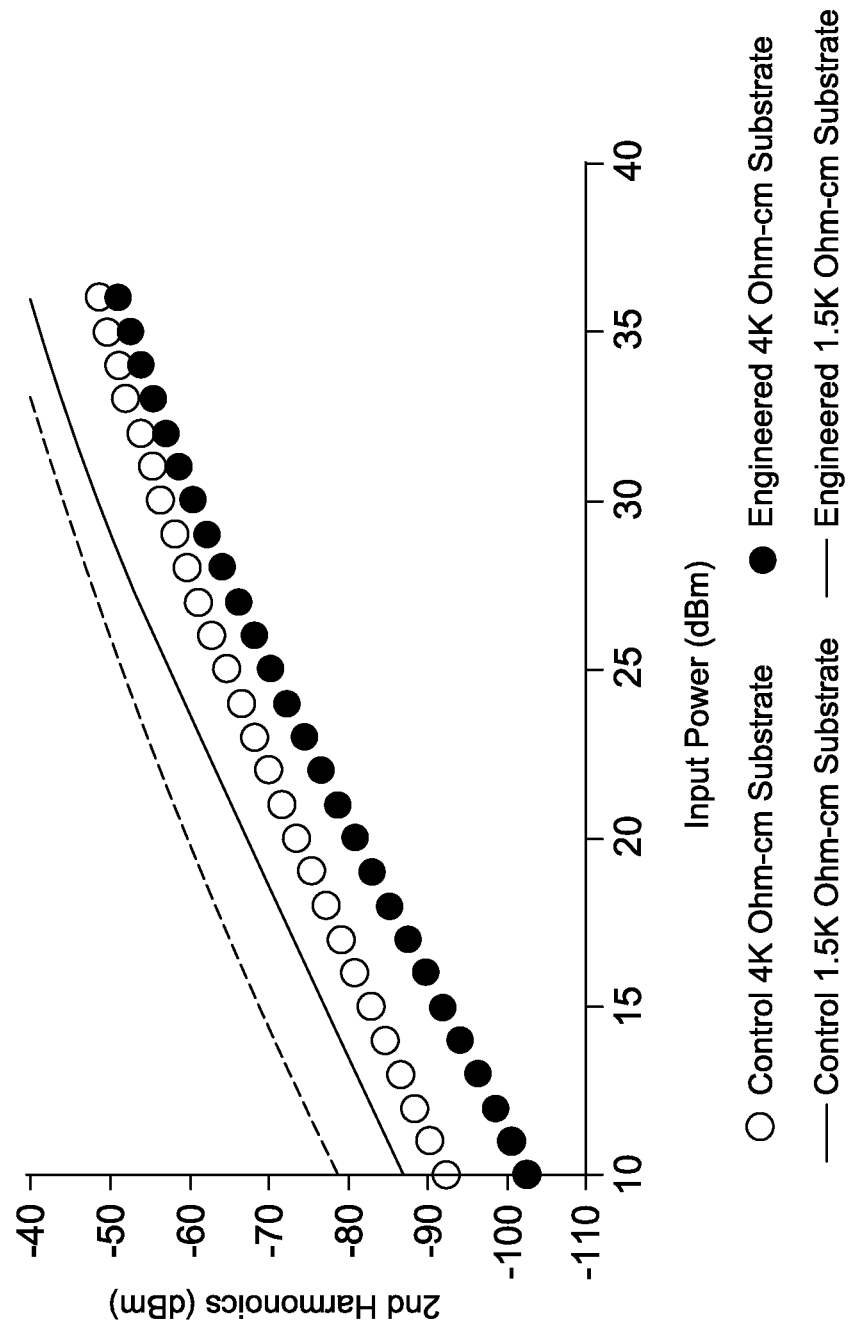
FIG. 5 is a graph demonstrating the enhanced RF performance on the engineered substrates according to some embodiments of the present invention. The data are from coplanar wave guide device measurement.

The epitaxial layer is grown with controlled thickness and target resistivity so that it is fully depleted, leading to a high apparent resistivity. The apparent high resistivity leads to enhanced RF performance, as depicted in FIG. 5, which depicts the reduction in second harmonic distortion. Advantageously, handle substrates having a lower range of resistivity may be used in RF devices, thereby eliminating process and metrology issues associated with UHR substrates.

I. Semiconductor Handle Substrate and Semiconductor Donor Substrate

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane.

Figure 3A:
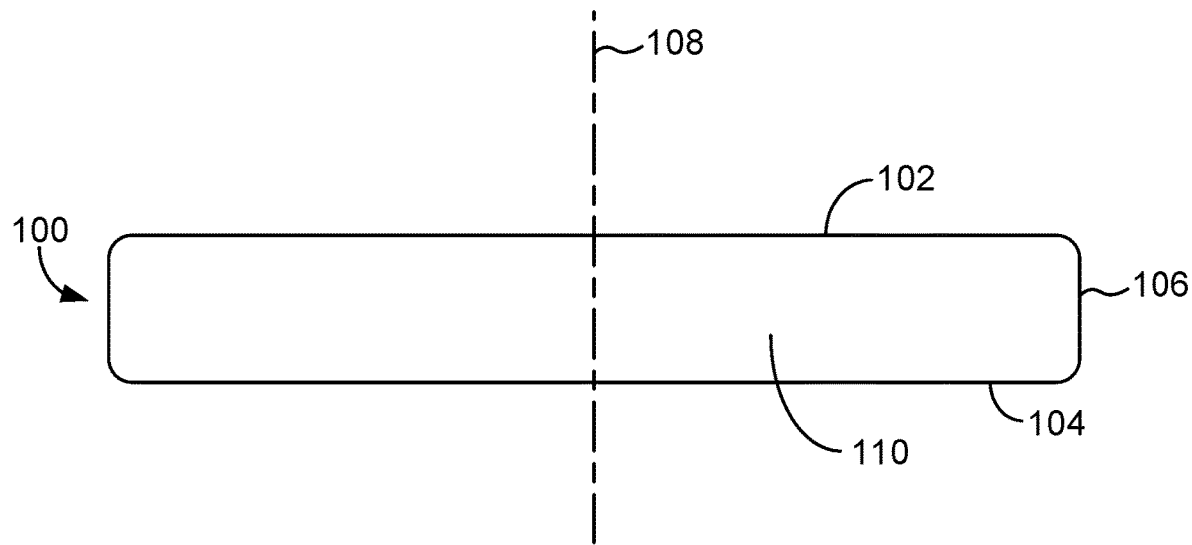
FIGS. 3A through 3E depict a process flow according to some embodiments of the present invention.

FIGS. 3A through 3E depict a process flow according to some embodiments of the present invention. With reference to FIG. 3A, an exemplary, non-limiting single crystal semiconductor handle wafer 100 is depicted. In general, the single crystal semiconductor handle wafer 100 comprises two major, generally parallel surfaces. One of the parallel surfaces is a front surface 102 of the single crystal semiconductor handle wafer 100, and the other parallel surface is a back surface 104 of the single crystal semiconductor handle wafer 100. The single crystal semiconductor handle wafer 100 comprises a circumferential edge 106 joining the front and back surfaces 102, 104. The single crystal semiconductor handle wafer 100 comprise a central axis 108 perpendicular to the two major, generally parallel surfaces 102, 104 and also perpendicular to a central plane defined by the points midway between the front and back surfaces 102, 104. The single crystal semiconductor handle wafer 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces 102, 104.

Prior to any operation as described herein, the front surface 102 and the back surface 104 of the single crystal semiconductor handle wafer 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer 100, e.g., a single crystal silicon handle wafer, refers to the major surface of the substrate that becomes an interior surface of the bonded structure. Accordingly, a "back surface" of a single crystal semiconductor handle wafer 100, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. In the context of the present invention, one or more insulating layers may be prepared on the front surfaces of either or both the single crystal semiconductor handle substrate 100 and the single crystal semiconductor donor substrate. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

The single crystal semiconductor handle wafer 100 may have any resistivity obtainable by the Czochralski or float zone methods. Accordingly, the resistivity of the single crystal semiconductor handle wafer 100 is based on the requirements of the end use/application of the structure of the present invention. The resistivity may therefore vary from milliohm or less to megaohm or more. In some embodiments, the single crystal semiconductor handle wafer 100 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle substrate comprises a p-type dopant. In some embodiments, the single crystal semiconductor handle substrate is a single crystal silicon wafer comprising a p-type dopant, such as boron.

In some embodiments, the single crystal semiconductor handle wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor handle wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle substrate has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some preferred embodiments, the single crystal semiconductor handle substrate comprises an electrically active dopant selected from the group consisting of boron, aluminum, gallium, indium, and any combination thereof. In some preferred embodiments, the single crystal semiconductor handle substrate comprises boron, which may be present in a concentration less than about $2 \times 10^{13}$ atoms/cm$^3$, less than about $1 \times 10^{13}$ atoms/cm$^3$, such as less than about $5 \times 10^{12}$ atoms/cm$^3$, or less than about $1 \times 10^{12}$ atoms/cm$^3$. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor handle wafer 100 may comprise single crystal silicon. The single crystal semiconductor handle wafer 100 may have, for example, any of (100), (110), or (111) crystal orientation, and the choice of crystal orientation may be dictated by the end use of the structure.

Optionally, the front surface 102, the back surface 104, or both may be oxidized according to methods known in the art. Oxidation may be accomplished by means known in the art, such as thermal oxidation (in which some portion of the deposited semiconductor material film will be consumed) or CVD oxide deposition. The oxidation layer on the front surface 102, the back surface 104, or both may be at least about 1 nanometer thick, such as between about 10 nanometers and about 5000 nanometers thick, such as between about 100 nanometers and about 1000 nanometers, or between about 200 nanometers and about 400 nanometers. In some embodiments, the oxidation layer is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution. In some embodiments, the SC1 solution comprises 5 parts deionized water, 1 part aqueous NH$_4$OH (ammonium hydroxide, 29% by weight of NH$_3$), and 1 part of aqueous H$_2$O$_2$ (hydrogen peroxide, 30%). In some embodiments, the handle substrate may be oxidized by exposure to an aqueous solution comprising an oxidizing agent, such as an SC2 solution. In some embodiments, the SC2 solution comprises 5 parts deionized water, 1 part aqueous HCl (hydrochloric acid, 39% by weight), and 1 part of aqueous H$_2$O$_2$ (hydrogen peroxide, 30%).

II. Epitaxial Deposition

Figure 3B:
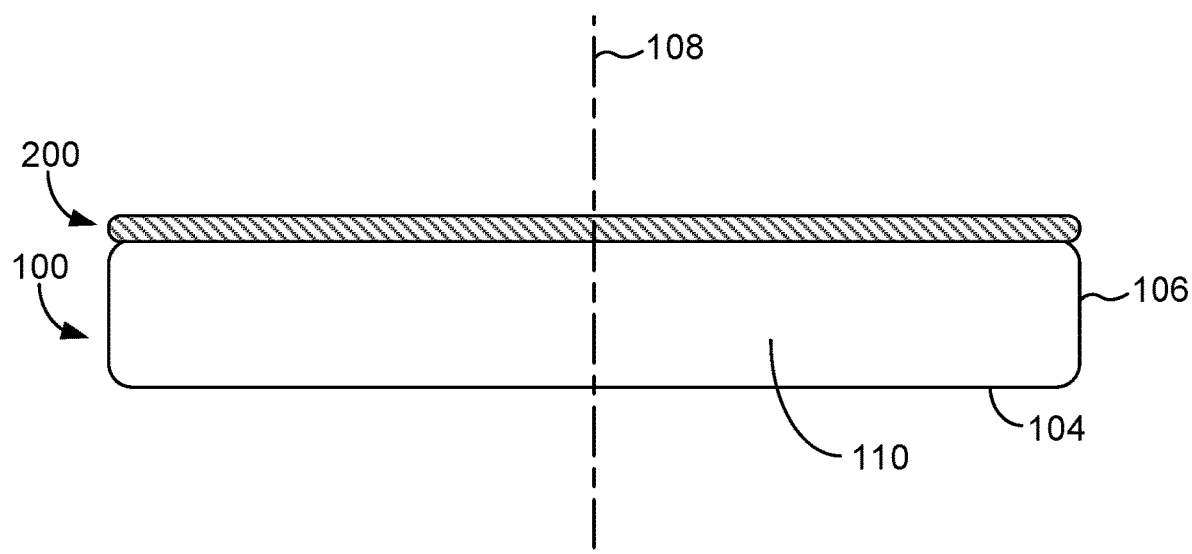

According to the method of the present invention, and with reference to FIGS. 3A and 3B, an epitaxial layer 200 is deposited by an epitaxial method upon the front surface 102 of the starting single crystal semiconductor handle substrate 100.

The epitaxial layer 200 may be deposited upon the front surface 102 of the starting single crystal semiconductor handle substrate 100 by a vapor phase epitaxial method or a liquid phase epitaxial method. For example, the epitaxial layer 200 may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), molecular beam epitaxy (MBE), or liquid phase epitaxy (LPE). Epitaxial deposition results in a semiconductor layer having the same underlying crystalline structure as the starting single crystal semiconductor handle substrate 100. For example, a single crystal silicon handle substrate 100 may have crystal orientations for (100), (100), and (110). In some embodiments, the single crystal silicon handle substrate 100 may have (100) crystal orientation. The epitaxial layer 200 conforms to the crystal orientation of the underlying substrate 100. Accordingly, in some embodiments, the single crystal silicon handle substrate 100 and the epitaxial layer 200 have (100) crystal orientation. A suitable reactor for epitaxial deposition is an ASM or an Applied Materials commercial epi reactor. The reaction conditions for epitaxial deposition include a temperature ranging from between about 600° C. and about 1100° C., at a pressure between about 1 Torr and about 760 Torr, such as between about 10 Torr and about 760 Torr. Hydrogen ($H_2$) is a suitable carrier gas at a flow rate of between about 10 slm and about 200 slm.

Silicon precursors for a vapor phase epitaxial method include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. The overall thickness of the epitaxial layer 200 comprising silicon may be between about 0.2 micrometers and about 20 micrometers thick, or between about 0.5 micrometers and about 10 micrometers thick, such as between about 5 micrometers and about 10 micrometers thick. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the epitaxial layer 200 comprises silicon doped with carbon at a carbon concentration between about 0.1 mole % and about 5 mole %, or between about 0.5 mole % and about 2 mole %. The overall thickness of the epitaxial layer 200 comprising silicon doped with carbon may between about 0.1 micrometers and about 20 micrometers thick, such as between about 0.1 micrometers and about 10 micrometers thick, such as between about 5 micrometers and about 10 micrometers thick.

In some embodiments, the epitaxial layer 200 may comprise an electrically active dopant. The dopant may be p-type such as boron (p type), gallium (p type), aluminum (p type), indium (p type) or n-type such as phosphorus (n type), antimony (n type), and arsenic (n type). A dopant may be incorporated into the epitaxial layer 200 by including an appropriate precursor gas, such as a boron precursor (e.g., by including diborane ($B_2H_6$) in the reaction gas mixture), an arsenic precursor (e.g., by include arsine ($ArH_3$) in the reaction gas mixture), a phosphorus precursor (e.g., by include phosphine ($PH_3$) in the reaction gas mixture), and an antimony precursor (e.g., by including dimeric antimony in the reaction gas mixture). The resistivity of the epitaxial layer may range from between about 100 ohm-cm and about 5000 ohm-cm, such as between about 200 ohm-cm and about 2000 ohm-cm, such as between about 400 ohm-cm and about 1000 ohm-cm. Accordingly, the concentration of an electrically active dopant in the epitaxial layer may be less than about $1 \times 10^{14}$ atoms/cm$^3$, less than about $1 \times 10^{13}$ atoms/cm$^3$, such as less than about $5 \times 10^{12}$ atoms/cm$^3$.

Figure 4:
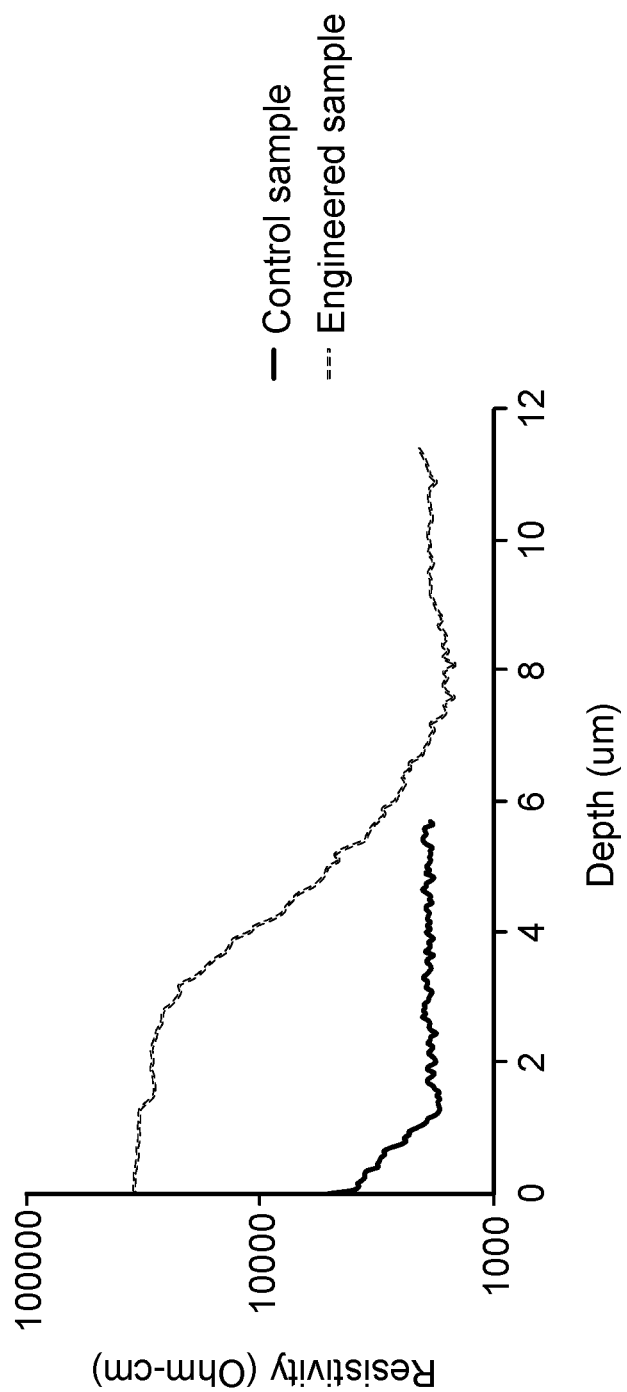
FIG. 4 is a graph demonstrating the resistivity of semiconductor material layered upon a substrate according to a structure of the present invention (engineered sample) and the resistivity of semiconductor material layered upon a substrate according to the conventional method (control sample).

In some embodiments, the epitaxial layer 200 may be doped with electrically active dopants of opposite type than the electrically active dopant within the single crystal semiconductor handle substrate 100 and. In some embodiments, the single crystal semiconductor handle substrate comprises an electrically active p-type dopant (e.g., boron (p type), gallium (p type), aluminum (p type), indium (p type)) at a concentration of less than about $2 \times 10^{13}$ atoms/cm$^3$, less than about $1 \times 10^{13}$ atoms/cm$^3$, such as less than about $5 \times 10^{12}$ atoms/cm$^3$, or less than about $1 \times 10^{12}$ atoms/cm$^3$. In some embodiments, the concentration of the electrically active p-type dopant (e.g., boron (p type), gallium (p type), aluminum (p type), indium (p type)) may be at least about $1 \times 10^{12}$ atoms/cm$^3$, such as at least about $2 \times 10^{12}$ atoms/cm$^3$. These concentrations generally correspond to a resistivity within the range of about 1000 ohm-cm and about 6000 ohm-cm. The epitaxial layer may comprise an electrically active n-type dopant (e.g., phosphorus (n type), antimony (n type), and arsenic (n type)) at a concentration of less than about $1 \times 10^{14}$ atoms/cm$^3$, less than about $1 \times 10^{13}$ atoms/cm$^3$, such as less than about $5 \times 10^{12}$ atoms/cm$^3$. In some embodiments, the concentration of the electrically active n-type dopant (e.g., phosphorus (n type), antimony (n type), and arsenic (n type)) is at least about $1 \times 10^{12}$ atoms/cm$^3$, such as at least about $2 \times 10^{12}$ atoms/cm$^3$. These concentrations generally correspond to a resistivity within the range between about 100 ohm-cm and about 5000 ohm-cm, such as between about 200 ohm-cm and about 2000 ohm-cm, such as between about 400 ohm-cm and about 1000 ohm-cm. The combination of the epitaxial layer dopant type, the epitaxial layer resistivity, and the epitaxial layer thickness, and the dopant type and resistivity of the handle substrate results in an epitaxial layer that is fully depleted. As a result, the epitaxial layer achieves an apparent resistivity of greater than about 5000 Ohm-cm, or even greater than about 10,000 Ohm-cm. See FIG. 4, which demonstrates the effect of the multilayer structure of the present invention compared to a control structure. FIG. 4 is a graph demonstrating the higher apparent resistivity of semiconductor material layered upon a substrate according to a structure of the present invention (engineered sample) compared to the the lower resistivity of semiconductor material layered upon a substrate according to the conventional method (control sample).

III. Deposition of Charge Trapping Layer

Figure 3C:
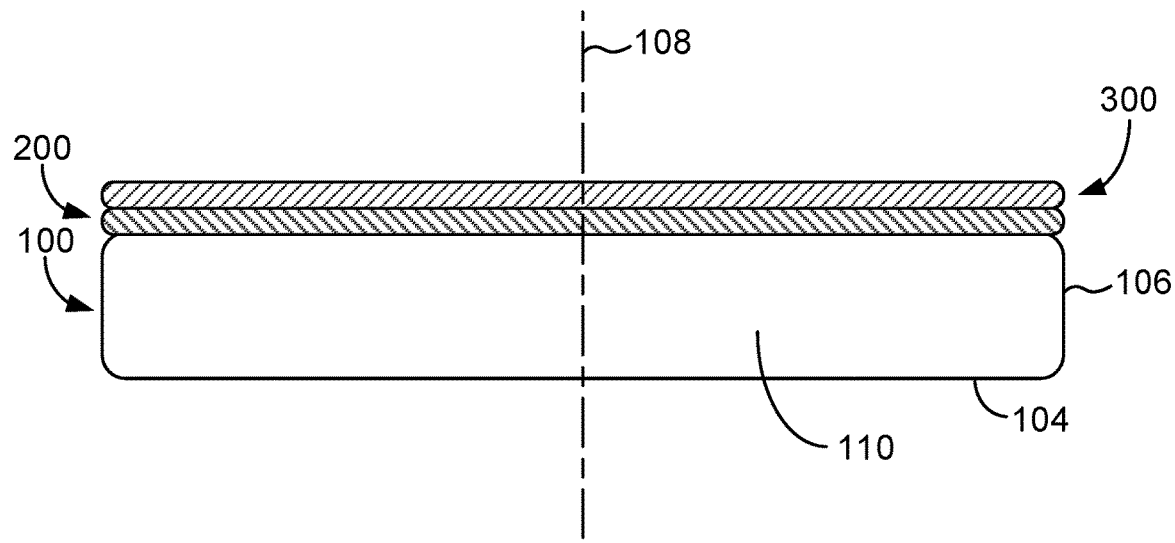

According to the method of the present invention and with reference to FIGS. 3B and 3C, a charge trapping layer 300 is deposited on the epitaxial layer 200. In some embodiments, the charge trapping layer 300 comprises polycrystalline silicon. Such materials include polycrystalline semiconductor materials and amorphous semiconductor materials. Materials that may be polycrystalline or amorphous include silicon (Si), silicon germanium (SiGe), silicon doped with carbon (SiC), and germanium (Ge). Polycrystalline semiconductor, e.g., polycrystalline silicon, denotes a material comprising small silicon crystals having random crystal orientations. Polycrystalline material denotes a material comprising small crystals having random crystal orientations. Polycrystalline grains may be as small in size as about 20 nanometers, and the grain size generally ranges from between about 20 nanometers and about 1 micrometer, such as between about 0.3 micrometer and about 1 micrometer. According to the method of the present invention, the smaller the crystal grain size of polycrystalline material deposited the higher the defectivity in the charge trapping layer. The resistivity of the polycrystalline silicon charge trapping layer may be at least 100 Ohm-cm, at least about 500 Ohm-cm, at least about 1000 Ohm-cm, at least about 3000 Ohm-cm, or even at least about 7000 ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 100,000 Ohm-cm, or between about 750 Ohm-cm and about 100,000 Ohm-cm. In some preferred embodiments, the resistivity of the polycrystalline silicon layer is between about 3000 Ohm-cm and about 100,000 Ohm-cm, such as between about 3000 Ohm-cm and about 10,000 Ohm-cm or even between about 7000 ohm-cm and about 100,000 ohm-cm, such as between about 7000 ohm-cm and about 10,000 ohm-cm.

The material for deposition of the charge trapping layer 300 onto the epitaxial layer 200 may be deposited by vapor deposition. The material for deposition of the charge trapping layer 300 onto the epitaxial layer 200 may be deposited by chemical or physical vapor deposition, for example, by metalorganic chemical vapor deposition (MOCVD), physical vapor deposition (PVD), chemical vapor deposition (CVD), low pressure chemical vapor deposition (LPCVD), or plasma enhanced chemical vapor deposition (PECVD). In preferred embodiments, polycrystalline silicon is deposited by CVD. Silicon precursors for CVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. In some preferred embodiments, the silicon precursor is selected from among silane, dichlorosilane ($SiH_2Cl_2$), and trichlorosilane ($SiHCl_3$). For example, polycrystalline silicon may be deposited onto the surface oxidation layer by CVD of silane, dichlorosilane ($SiH_2Cl_2$), and trichlorosilane ($SiHCl_3$) in a temperature greater than about 850° C., such as between about 850° C. and about 1100° C., or between about 850° C. and about 1000° C. The high temperature contributes, among other advantages, high growth rate, thereby contributing to throughput and cost reduction. CVD deposition rates may range be at least about 0.1 micrometer/minute, such as between about 0.1 micrometer/minute to about 10 micrometers/minute, or between about 0.1 micrometer/minute to about 2 micrometers/minute. Deposition of the polycrystalline silicon layer may continue until the layer has a thickness of at least about 0.1 micrometer, such as between about 0.1 micrometer and about 50 micrometers, such as between about 0.1 micrometer and about 20 micrometers, between about 0.1 micrometer and about 10 micrometers, between about 0.5 micrometer and about 5 micrometers, or between about 0.5 micrometer and about 3 micrometers, such as between about 1 micrometer and about 2 micrometers or between about 2 micrometers and about 5 micrometers. Deposition may occur at a pressure between about 1 Torr and about 760 Torr, such as between about 1 Torr and about 400 Torr.

In some embodiments, deposition of the polycrystalline silicon layer by chemical vapor deposition is interrupted after deposition of a polycrystalline silicon seed layer. The polycrystalline silicon seed layer may have a thickness less than the overall desired thickness of the final polycrystalline silicon charge trapping layer. Accordingly, the polycrystalline seed layer may be deposited to a thickness of less than 20 micrometers, less than 10 micrometers, less than 5 micrometers, less than 3 micrometers, less than 2 micrometers, or less than 1 micrometer, or less than 0.5 micrometer, such as between about 50 nanometers and about 20 micrometers, or between about 50 nanometers and about 10 micrometers, or between about 50 nanometers and about 5 micrometers, or between about 50 nanometers and about 3 micrometers, or between about 50 nanometers and about 2 micrometers, or between about 50 nanometers and about 1 micrometers, or between about 50 nanometers and about 500 nanometers, or between about 50 nanometers and about 200 nanometers. The thickness of the seed layer is set by the size of the polysilicon nuclei. To achieve effective stress release, the seed layer needs to cover the surface of the underlying layer while leaving voids smaller than 50 nm, which enables the access of $H_2$ to the interface between the polysilicon seed layer and the underlying layer. $H_2$ reduces interfacial oxide and promotes the diffusion of the atoms at the grain boundaries of the polysilicon seed layer to the substrate and thus releases the film stress. When the seed layer is thick enough to completely prevent $H_2$ access to the underlying layer, the subsequent annealing process is not able to release the film stress effectively. On the other hand, when the seed layer is not continuous and the opening area between two adjacent nuclei is wider than 50 nm, large nuclei are formed during the seed annealing process. The large nuclei will grow into large grains (i.e., diameter >1 um) at the end of polysilicon deposition, which reduces the trapping efficiency. Deposition may be interrupted by ceasing the flow of silicon precursors into the CVD chamber. After interruption of the deposition of polycrystalline silicon, the handle substrate comprising the polycrystalline seed layer may be annealed. Annealing the polycrystalline seed layer contributes to desirable charge trapping layer properties, such as obtaining a clean surface, a high purity film, a high resistivity film, desired nuclei size and uniformity, and reduction of residual film stress. In some embodiments, the polycrystalline silicon seed layer is subjected to a high temperature anneal in order to reduce film stress to a range between about 0 MPa and about 500 MPa, such as between about 0 MPa and about 100 MPa. The polycrystalline seed layer is annealed at a temperature greater than about 1000° C., such as between about 1000° C. and about 1200° C., or between about 1000° C. and about 1100° C. The seed layer may be annealed for a duration between about 1 second and about 300 seconds, such as between about 5 seconds and about 60 seconds, or between about 10 seconds and about 40 seconds. The ambient atmosphere for anneal may comprise hydrogen, hydrogen chloride, chlorine, or any combination of hydrogen, hydrogen chloride, and chlorine. The annealing step can be performed at reduced pressure or atmospheric pressure, such as between about 1 Torr and about 760 Torr, or between about 10 Torr and about 760 Torr. The grain size and the stress of the polycrystalline silicon film is controlled by the annealing temperature, duration, and gas flow. After the appropriate anneal duration, deposition by chemical vapor deposition of the polycrystalline silicon layer is resumed after cooling the single crystal semiconductor handle substrate to a temperature between about 850° C. and about 1000° C.

In some embodiments, the single crystal semiconductor handle substrate 100 comprising the epitaxial layer 200 and the polycrystalline silicon charge trapping layer 300 is annealed after deposition is complete. Annealing the polycrystalline layer contributes to desirable charge trapping layer properties, such as obtaining a clean surface, a high purity film, a high resistivity film, desired nuclei size and uniformity, and reduction of residual film stress. In some embodiments, the fully deposited polycrystalline silicon charge trapping layer is subjected to a high temperature anneal in order to reduce film stress to a range between about 0 MPa and about 500 MPa, such as between about 0 MPa and about 100 MPa. The handle substrate 100 comprising the epitaxial layer 200 and the polycrystalline silicon charge trapping layer 300 may be annealed at a temperature greater than about 1000° C., such as between about 1000° C. and about 1100° C. The handle substrate 100 comprising the epitaxial layer 200 and the polycrystalline silicon charge trapping layer 300 may be annealed for a duration between about 1 second and about 300 seconds, such as between about 5 seconds and about 60 seconds, or between about 10 seconds and about 40 seconds. The ambient atmosphere for anneal may comprise hydrogen, hydrogen chloride, chlorine, or any combination of hydrogen, hydrogen chloride, and chlorine. After the appropriate anneal duration, the CVD chamber may be cooled to a temperature safe for removal single crystal semiconductor handle substrate.

In some embodiments, an insulating or dielectric layer may be formed on top of the deposited charge trapping layer 300. The insulating layer may comprise a semiconductor oxide, a semiconductor nitride, or a semiconductor oxynitride. The dielectric layer according to the present invention may comprise insulating materials selected from among silicon dioxide, silicon nitride, silicon oxynitride, hafnium oxide, titanium oxide, zirconium oxide, lanthanum oxide, barium oxide, and any combination thereof. In some embodiments, the dielectric layer comprises one or more insulating material selected from the group consisting of silicon dioxide, silicon nitride, silicon oxynitride, and any combination thereof. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. In some embodiments, the dielectric layer comprises three insulating layers. In some embodiments, the three insulating layers comprise a silicon dioxide layer, a silicon nitride layer in interfacial contact with the silicon dioxide layer, and a silicon dioxide layer in interfacial contact with the silicon nitride layer.

Deposition of the insulating layer may be accomplished by means known in the art, such as thermal oxidation (in which some portion of the deposited semiconductor material film will be consumed) and/or CVD oxide and/or nitride deposition. In some embodiments, the charge trapping layer may be thermally oxidized (in which some portion of the deposited semiconductor material film will be consumed) or the film may be grown by CVD oxide and/or nitride deposition. In some embodiments, the charge trapping layer may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). In an exemplary embodiment, semiconductor handle wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In order to incorporate nitrogen in the interfacial layer to deposit silicon nitride or silicon oxynitride, the atmosphere may comprise nitrogen alone or a combination of oxygen and nitrogen, and the temperature may be increased to a temperature between 1100° C. and 1400° C. An alternative nitrogen source is ammonia. In some embodiments, the charge trapping layer may be treated for a duration sufficient to provide an insulating layer of between about 2000 angstroms and about 10,000 angstroms thickness.

After deposition of the charge trapping layer 300, and optional deposition of an insulating layer, wafer cleaning and polishing is optional. In some embodiments, the deposited polycrystalline silicon charge trapping layer has a surface roughness as measured by $RMS_{2\times2 \; um2}$ on the order of 50 nanometers. If desired, the wafers can be cleaned, for example, in a standard SC1/SC2 solution. Additionally, the wafers, particularly, the charge trapping layer or the optional insulating layer, may be subjected to chemical mechanical polishing (CMP) to reduce the surface roughness, preferably to the level of $RMS_{2\times2 \; um2}$ is less than about 5 angstroms, preferably less than about 2 angstroms, such as between about 1 angstrom and about 2 angstroms, wherein root mean squared—

$$R_q = \sqrt{\frac{1}{n}\sum_{i=1}^{n} y_i^2}$$

The roughness profile contains ordered, equally spaced points along the trace, and $y_i$ is the vertical distance from the mean line to the data point. At a surface roughness of preferably less than 2 angstroms, the surface is ready for bonding.

IV. Plasma Activation

In some embodiments, the single crystal semiconductor handle substrate 100 comprising the epitaxial layer 200 and the polycrystalline silicon charge trapping layer 300 is subjected to oxygen plasma and/or nitrogen plasma surface activation. In some embodiments, the oxygen plasma and/or nitrogen plasma surface activation tool is a commercially available tool, such as those available from EV Group, such as EVG®810LT Low Temp Plasma Activation System. The single crystal semiconductor handle substrate 100 comprising the epitaxial layer 200 and the polycrystalline silicon charge trapping layer 300 is loaded into the chamber. The chamber is evacuated and backfilled with an oxygen gas source and/or a nitrogen gas source in a carrier gas, such as argon, to a pressure less than atmospheric to thereby create the plasma. Oxygen and/or water are suitable source gases for plasma oxide treatment. Ammonia and/or nitrogen and/or nitric oxide (NO) and/or nitrous oxide ($N_2O$) gas are suitable source gases for plasma nitride treatment. Oxynitride plasma films may be deposited by including oxygen and nitrogen gas sources. Additionally, the use of nitric oxide or nitrous oxide additionally incorporates oxygen in to the insulating layer, thereby depositing an oxynitride film. To deposit a silicon nitride or a silicon oxide plasma film, suitable silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. Suitably, Ar is added as a carrier gas.

The single crystal semiconductor handle substrate 100 is exposed to this plasma for the desired time, which may range from about 1 second to about 120 seconds, in order to grow a thin oxide, nitride, or oxynitride layer. The oxide, nitride, or oxynitride layer may have a thickness ranging from about 10 angstroms to about 100 angstroms. This nitride layer can act as an effective diffusion barrier to prevent diffusion of contaminants trapped at the bond interface from diffusing in and through the Poly Silicon trap layer. Plasma surface activation is performed in order to render the surface of the charge trapping layer 300 or the surface of the optional insulating layer hydrophilic and amenable to bonding to a single crystal semiconductor donor substrate. After plasma activation, the activated surface is rinsed with deionized water. The wafer is then spun dry prior to bonding.

V. Preparation of the Bonded Structure

Figure 3D:
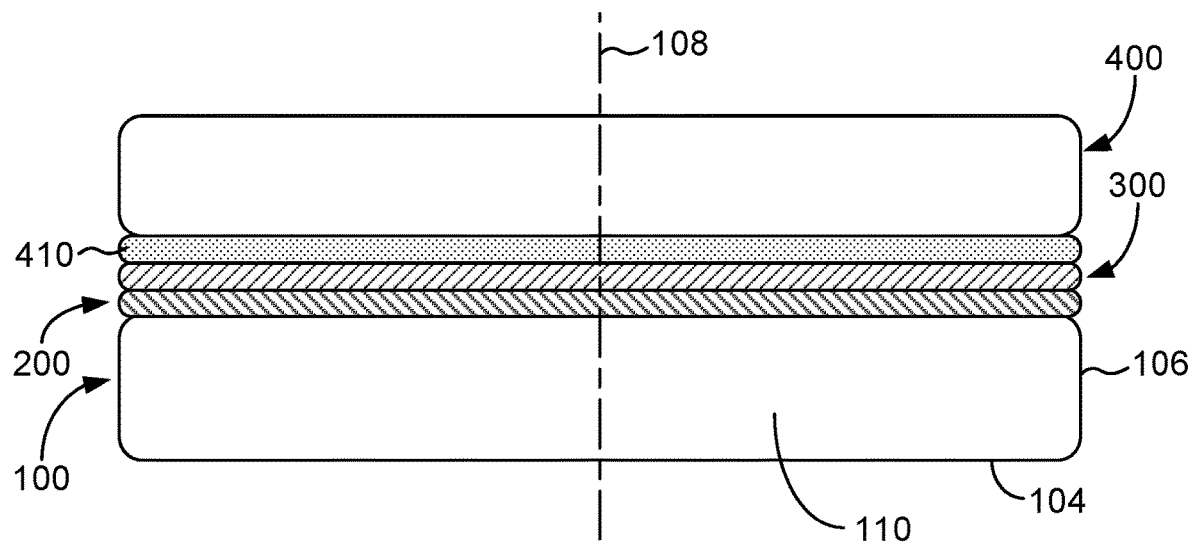
Figure 3E:
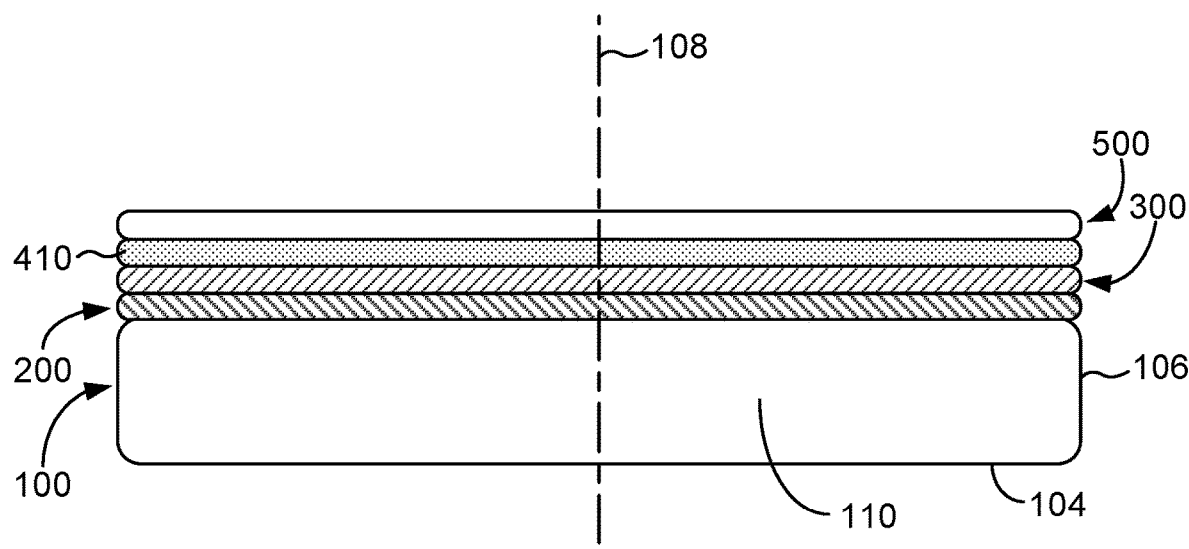

With reference to FIG. 3D, the high resistivity single crystal semiconductor handle substrate 100, e.g. a single crystal semiconductor handle wafer such as a single crystal silicon handle wafer, prepared according to the method described herein comprising the epitaxial layer 200 and the polycrystalline silicon charge trapping layer 300 is next bonded to a semiconductor donor substrate 400, e.g., a single crystal semiconductor donor wafer, which is prepared according to conventional layer transfer methods. The single crystal semiconductor donor substrate 400 may be a single crystal semiconductor wafer. In preferred embodiments, the semiconductor wafer comprises a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer 400 may comprise a dopant selected from among boron (p type), gallium (p type), aluminum (p type), indium (p type), phosphorus (n type), antimony (n type), and arsenic (n type). The resistivity of the single crystal semiconductor (e.g., silicon) donor wafer may range from 1 to 50 Ohm-cm, typically, from 5 to 25 Ohm-cm. The single crystal semiconductor donor wafer 400 may be subjected to standard process steps including oxidation, implant, and post implant cleaning. Accordingly, a semiconductor donor substrate 400, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the semiconductor donor substrate 400 comprises a dielectric layer 410. The dielectric layer 410 according to the present invention may comprise insulating materials selected from among silicon dioxide, silicon nitride, silicon oxynitride, hafnium oxide, titanium oxide, zirconium oxide, lanthanum oxide, barium oxide, and any combination thereof. In some embodiments, the dielectric layer 410 comprises one or more insulating layers comprising a material selected from the group consisting of silicon dioxide, silicon nitride, silicon oxynitride, and any combination thereof. In some embodiments, the dielectric layer has a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the dielectric layer 410 comprises multiple layers of insulating material. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers.

In some embodiments, the front surface of the single crystal semiconductor donor substrate 400 (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate 400 may be thermally oxidized in a furnace such as an ASM A400 in the same manner described above. In some embodiments, the single crystal semiconductor donor substrate 400 is oxidized to provide an oxide layer on the front surface layer of at least about 1 nanometer thick, about 10 nanometer thick, such as between about 10 nanometers and about 10,000 nanometers, between about 10 nanometers and about 5,000 nanometers, or between about 100 nanometers and about 400 nanometers. In some embodiments, the oxidation layer on the single crystal semiconductor donor substrate 400 is relatively thin, such as between about 5 angstroms and about 25 angstroms, such as between about 10 angstroms and about 15 angstroms. Thin oxide layers can be obtained by exposure to a standard cleaning solution, such as an SC1/SC2 cleaning solution.

Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. The ions may be implanted to a depth between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate 400 having an ion implant region therein formed by $He^+$, $H^+$, $H_2^+$, and any combination thereof ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 350° C., preferably about 350° C. Thermal annealing may occur for a duration of from about 2 hours to about 10 hours, such as from about 2 hours to about 2 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ or $N_2$ to a pressure less than atmospheric to thereby create the plasma. The single crystal semiconductor donor wafer is exposed to this plasma for the desired time, which may range from about 1 second to about 120 seconds. Oxygen or nitrogen plasma surface oxidation is performed in order to render the front surface of the single crystal semiconductor donor substrate hydrophilic and amenable to bonding to a single crystal semiconductor handle substrate prepared according to the method described above. After plasma activation, the activated surface is rinsed with deionized water. The wafer is then spun dry prior to bonding.

The hydrophilic front surface layer of the single crystal semiconductor donor substrate 400 and the front surface of single crystal semiconductor handle substrate 100 comprising the epitaxial layer 200 and the polycrystalline silicon charge trapping layer 300 are next brought into intimate contact to thereby form a bonded structure. The bonded structure comprises a dielectric layer 410, e.g., a buried oxide such as silicon oxide.

Since the mechanical bond is relatively weak, the bonded structure is further annealed to solidify the bond between the single crystal semiconductor donor substrate 400 and the single crystal semiconductor handle substrate 100 comprising the epitaxial layer 200 and the polycrystalline silicon charge trapping layer 300. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 350° C., preferably about 350° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

In some embodiments, the anneal may occur at relatively high pressures, such as between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa. In conventional bonding methods, the temperature is likely limited by the "autocleave". This occurs when the pressure of the platelets at the implant plane exceeds the external isostatic pressure. Accordingly, conventional anneal may be limited to bonding temperatures between about 350° C. and about 400° C. because of autocleave. After implantation and bond, the wafers are weakly held together. But the gap between the wafers is sufficient to prevent gas penetration or escape. Weak bonds can be strengthened by heat treatments, but the cavities formed during implant are filled with gas. While heating, the gas inside the cavities pressurizes. It is estimated that the pressure may reach 0.2-1 GPa (Cherkashin et al., J. Appl. Phys. 118, 245301 (2015)), depending on the dosage. When the pressure exceeds a critical value, the layer delaminates. This is referred to as an autocleave or thermal cleave. It prevents higher temperature or longer time in the anneal. According to some embodiments of the present invention, bonding occurs at elevated pressures, e.g., between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa, which thereby enables bonding at elevated temperatures. In some embodiments, the bonded structure is annealed at a temperature of from about 300° C. to about 700° C., from about 400° C. to about 600° C., such as between about 400° C. and about 450° C., or even between about 450° C. and about 600° C., or between about 350° C. and about 450° C. Increasing the thermal budget will have a positive effect on the bond strength. Thermal annealing may occur for a duration of from about 0.5 hours to about 10 hour, such as between about 0.5 hours and about 3 hours, preferably a duration of about 2 hours. Thermal annealing within these temperatures ranges is sufficient to form a thermally activated cleave plane. In conventional bonding anneals, the edge of both the handle wafer and donor wafer may become far apart due to the roll off. In this area, there is no layer transfer. It is called the terrace. Pressurized bonding is expected to reduce this terrace, extending the SOI layer further out towards the edge. The mechanism is based on trapped pockets of air being compressed and "zippering" outwards. After the thermal anneal to activate the cleave plane, the bonded structure may be cleaved.

After the thermal anneal, the bond between the single crystal single crystal semiconductor donor substrate 400 and the single crystal semiconductor handle substrate 100 comprising the epitaxial layer 200 and the polycrystalline silicon charge trapping layer 300 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer

500, preferably a silicon device layer, on the semiconductor-on-insulator composite structure. See FIG. 3E.

After cleaving, the cleaved structure may be subjected to a high temperature anneal in order to further strengthen the bond between the transferred device layer 500 and the single crystal semiconductor handle substrate 100 comprising the epitaxial layer 200 and the polycrystalline silicon charge trapping layer 300. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 2 to 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas. In some embodiments, the semiconductor device layer 500 may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers. Thick film device layers may have a device layer thickness between about 1.5 micrometers and about 20 micrometers. Thin film device layers may have a thickness between about 0.01 micrometer and about 0.20 micrometer.

In some embodiments, an epitaxial layer may be deposited on the transferred single crystal semiconductor device layer 500. A deposited epitaxial layer may comprise substantially the same electrical characteristics as the underlying single crystal semiconductor device layer 500. Alternatively, the epitaxial layer may comprise different electrical characteristics as the underlying single crystal semiconductor device layer 500. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise a dopant selected from among boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers.

The finished SOI wafer comprises the single crystal semiconductor handle substrate 100, the epitaxial layer 200, the polycrystalline silicon charge trapping layer 300, the dielectric layer 410 (e.g., buried oxide layer), and the semiconductor device layer 500, may then be subjected to end of line metrology inspections and cleaned a final time using typical SC1-SC2 process.

Example 1

Two groups of 200 mm diameter boron doped silicon (100) substrates with resistivity of 1,500 and 4,000 Ohm-cm, respectively, were used to demonstrate the advantage of using an engineered epitaxial layer to boost the RF performance. The substrates were cleaned using SC1/SC2 clean in a commercial wet bench followed by epitaxial growth of a silicon layer of between 5 micrometers and 10 micrometers (5 micrometers in this example). Silicon epitaxial growth was conducted in a 200 mm Centura reactor at a temperature between 1000° C. and 1100° C. (1100° C. in this example) at atmospheric pressure. Trichlorosilane (TCS) was used as the Silicon precursor, and $H_2$ as the carrier gas. Typical process conditions used to provide a growth rate of between 2 micrometers/minute and 4 micrometers/minute (4 um/min in this example) growth rate were: TCS at a flow rate of 10 g/min, $H_2$ at a flow rate of 20 slm. The epitaxial layer target resistivity was controlled between 200-2000 Ohm-cm (1000 Ohm-cm in this example) by the growth temperature and n-type TCS background doping. After the silicon epitaxial layer was complete, the wafers were unloaded from the reactor and cleaned with SC1/SC2 to form a chemical oxide, which was followed by subsequent 2.8 um thick polycrystalline silicon deposition in the same reactor using the same gas flows except that the deposition temperature is between 900° C. and 1000° C. (950° C. in this example). The control wafer did not receive silicon epitaxial growth but polycrystalline silicon deposition only. The wafers were then polished to form a smooth polycrystalline silicon surface with only 2 um polycrystalline silicon left and were used as the handle substrates for SOI manufacturing. Both SRP and Coplanar waveguide (CPW) RF measurements were conducted on the finished SOI wafers. The SRP profile in FIG. 4 shows the substantially increased resistivity from the polycrystalline silicon to the handle substrate in the engineered handle substrate because of the depletion of the epitaxial layer by the p-type handle substrate. As a result of the significantly reduced free carriers in the substrate, HD2 is reduced by 10-15%. See FIG. 5. In order to achieve similar performance enhancement without the above disclosed engineering approach, a substrate with resistivity of 10 times higher is required, which is susceptible to type flipping during the device fabrication thermal processes. Type flipping leads to uncontrollable substrate resistivity and poses negative impact on device performance.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of preparing a multilayer substrate, the method comprising:

epitaxially depositing an epitaxial layer directly on the front surface of a single crystal semiconductor handle substrate, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm and further wherein the single crystal semiconductor handle substrate has a handle crystal orientation and wherein the epitaxial layer has a resistivity between about 100 ohm-cm and about 5000 ohm-cm and further wherein the epitaxial layer has a crystal orientation that is the same as the handle crystal orientation;

depositing a charge trapping layer directly on the epitaxial layer, the charge trapping layer comprising polycrystalline silicon having a resistivity of at least about 3000 ohm-cm; and bonding a dielectric layer directly on a front surface of a single crystal semiconductor donor substrate to the charge trapping layer to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, wherein the single crystal semiconductor donor substrate comprises a cleave plane.

2. The method of claim 1 wherein the single crystal semiconductor handle substrate comprises single crystal silicon.

3. The method of claim 1 wherein the single crystal semiconductor donor substrate comprises single crystal silicon.

4. The method of claim 1 wherein the single crystal semiconductor handle substrate has a bulk resistivity between about 1000 Ohm-cm and about 100,000 Ohm-cm.

5. The method of claim 1 wherein the single crystal semiconductor handle substrate has a bulk resistivity between about 1000 Ohm-cm and about 6,000 Ohm-cm.

6. The method of claim 1 wherein the single crystal semiconductor handle substrate comprises an electrically active dopant selected from the group consisting of boron, aluminum, gallium, indium, and any combination thereof.

7. The method of claim 1 wherein the epitaxial layer has a resistivity between about 200 ohm-cm and about 2000 ohm-cm.

8. The method of claim 1 wherein the epitaxial layer has a resistivity between about 400 ohm-cm and about 1000 ohm-cm.

9. The method of claim 1 wherein the epitaxial layer comprises silicon and an electrically active dopant selected from the group consisting of arsenic, phosphorus, antimony, and any combination thereof.

10. The method of claim 9 wherein the epitaxial layer comprising silicon is between about 0.2 micrometers and about 20 micrometers thick.

11. The method of claim 9 wherein the epitaxial layer comprising silicon is between about 0.5 micrometers and about 10 micrometers thick.

12. The method of claim 1 wherein the epitaxial layer comprises silicon doped with carbon at a carbon concentration between about 0.1 mole % and about 5 mole %.

13. The method of claim 12 wherein the epitaxial layer comprises silicon doped with carbon at a carbon concentration between about 0.5 mole % and about 2 mole %.

14. The method of claim 12 wherein the epitaxial layer comprising silicon doped with carbon is between about 0.1 micrometers and about 10 micrometers thick.

15. The method of claim 1 wherein the charge trapping layer has a resistivity of at least about 7000 ohm-cm.

16. The method of claim 1 further comprising forming an insulating layer on the charge trapping layer prior to bonding with the dielectric layer on the front surface of the single crystal semiconductor donor substrate, wherein the insulating layer comprises semiconductor oxide or semiconductor oxynitride.

17. The method of claim 1 wherein the dielectric layer comprises a material selected from the group consisting of silicon dioxide, silicon nitride, silicon oxynitride, hafnium oxide, titanium oxide, zirconium oxide, lanthanum oxide, barium oxide, and a combination thereof.

18. The method of claim 1 further comprising heating the bonded structure at a temperature and for a duration sufficient to strengthen the bond between the dielectric layer of the single crystal semiconductor donor substrate and the charge trapping layer on the front surface of the single crystal semiconductor handle substrate.

19. The method of claim 1 further comprising mechanically cleaving the bonded structure at the cleave plane of the single crystal semiconductor donor substrate to thereby prepare a cleaved structure comprising the single crystal semiconductor handle substrate, the epitaxial layer, the charge trapping layer, the dielectric layer, and a single crystal semiconductor device layer.

20. A method of preparing a multilayer substrate, the method comprising:

epitaxially depositing an epitaxial layer directly on the front surface of a single crystal semiconductor handle substrate, wherein the comprises single crystal semiconductor handle substrate two major, generally parallel surfaces, one of which is the front surface of the single crystal semiconductor handle substrate and the other of which is a back surface of the single crystal semiconductor handle substrate, a circumferential edge joining the front surface and the back surface of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate comprises an electrically active p-type dopant selected from the group consisting of boron, aluminum, gallium, indium, and any combination thereof and further wherein the single crystal semiconductor handle substrate has a handle crystal orientation and wherein the epitaxial layer comprises an electrically active n-type dopant selected from the group consisting of arsenic, phosphorus, antimony, and any combination thereof, wherein the concentration of the electrically active n-type dopant is less than about $1 \times 10^{14}$ atoms/cm$^3$ and further wherein the epitaxial layer has a crystal orientation that is the same as the handle crystal orientation;

depositing a charge trapping layer directly on the epitaxial layer, the charge trapping layer comprising polycrystalline silicon; and bonding a dielectric layer directly on a front surface of a single crystal semiconductor donor substrate to the charge trapping layer to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, wherein the single crystal semiconductor donor substrate comprises a cleave plane.

21. The method of claim 20 wherein the single crystal semiconductor handle substrate comprises single crystal silicon.

22. The method of claim 20 wherein the single crystal semiconductor donor substrate comprises single crystal silicon.

23. The method of claim 20 wherein the single crystal semiconductor handle substrate comprises the electrically active p-type dopant at a concentration of less than about $2 \times 10^{13}$ atoms/cm$^3$.

24. The method of claim 20 wherein the single crystal semiconductor handle substrate comprises the electrically active p-type dopant at a concentration of less than about $1 \times 10^{13}$ atoms/cm$^3$.

25. The method of claim 20 wherein the single crystal semiconductor handle substrate comprises the electrically active p-type dopant at a concentration of less than about $5 \times 10^{12}$ atoms/cm$^3$.

26. The method of claim 20 wherein the concentration of the electrically active n-type dopant in the epitaxial layer is less than about $1 \times 10^{13}$ atoms/cm$^3$.

27. The method of claim 20 wherein the concentration of the electrically active n-type dopant in the epitaxial layer is less than about $5 \times 10^{12}$ atoms/cm$^3$.

28. The method of claim 20 wherein the epitaxial layer comprises silicon.

29. The method of claim 28 wherein the epitaxial layer comprising silicon is between about 0.2 micrometers and about 20 micrometers thick.

30. The method of claim 20 wherein the epitaxial layer comprises silicon doped with carbon at a carbon concentration between about 0.1 mole % and about 5 mole %.

31. The method of claim 20 wherein the epitaxial layer comprises silicon doped with carbon at a carbon concentration between about 0.5 mole % and about 2 mole %.

32. The method of claim 20 wherein the charge trapping layer has a resistivity of at least about 3000 ohm-cm.

33. The method of claim 20 wherein the charge trapping layer has a resistivity of at least about 7000 ohm-cm.

34. The method of claim 20 further comprising forming an insulating layer on the charge trapping layer prior to bonding with the dielectric layer on the front surface of the single crystal semiconductor donor substrate, wherein the insulating layer comprises semiconductor oxide or semiconductor oxynitride.

35. The method of claim 20 wherein the dielectric layer comprises a material selected from the group consisting of silicon dioxide, silicon nitride, silicon oxynitride, hafnium oxide, titanium oxide, zirconium oxide, lanthanum oxide, barium oxide, and a combination thereof.

36. The method of claim 20 further comprising heating the bonded structure at a temperature and for a duration sufficient to strengthen the bond between the dielectric layer of the single crystal semiconductor donor substrate and the charge trapping layer on the front surface of the single crystal semiconductor handle substrate.

37. The method of claim 20 further comprising mechanically cleaving the bonded structure at the cleave plane of the single crystal semiconductor donor substrate to thereby prepare a cleaved structure comprising the single crystal semiconductor handle substrate, the epitaxial layer, the charge trapping layer, the dielectric layer, and a single crystal semiconductor device layer.

* * * * *